United States Patent
Park

(10) Patent No.: US 7,663,937 B2
(45) Date of Patent: Feb. 16, 2010

(54) SEMICONDUCTOR MEMORY DEVICE

(75) Inventor: Jin Su Park, Daegu (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/951,242

(22) Filed: Dec. 5, 2007

(65) Prior Publication Data
US 2008/0225604 A1    Sep. 18, 2008

(30) Foreign Application Priority Data
Mar. 15, 2007    (KR) .................. 10-2007-0025507

(51) Int. Cl.
*G11C 16/04* (2006.01)
(52) U.S. Cl. ................. 365/189.05; 365/185.12; 365/234; 365/238.5
(58) Field of Classification Search .......... 365/189.05, 365/238.5, 218, 235, 185.29, 185.12
See application file for complete search history.

(56) References Cited

U.S. PATENT DOCUMENTS

| | | | |
|---|---|---|---|
| 6,469,955 B1 | 10/2002 | Tsao et al. | |
| 6,717,861 B2 * | 4/2004 | Jeong et al. | 365/185.28 |
| 6,940,758 B2 * | 9/2005 | Chung | 365/185.25 |
| 7,173,861 B2 * | 2/2007 | Cho et al. | 365/185.29 |
| 7,245,533 B2 * | 7/2007 | Shibata | 365/185.17 |

FOREIGN PATENT DOCUMENTS

| | | |
|---|---|---|
| JP | 2002-134633 | 5/2002 |
| KR | 1020010061482 A | 7/2001 |
| KR | 1020020057687 A | 7/2002 |
| KR | 1020050095191 A | 9/2005 |
| KR | 1020060104404 A | 10/2006 |

\* cited by examiner

*Primary Examiner*—David Lam
(74) *Attorney, Agent, or Firm*—Townsend and Townsend and Crew LLP

(57) ABSTRACT

A semiconductor memory having a plurality of memory cells coupled to bit lines includes a bit line selecting circuit, a latch circuit, and a switching circuit. The bit line selecting circuit is disposed in a cell area where the memory cells are formed. The bit line selecting circuit is configured to select one of the bit lines in response to a first control signal. The latch circuit is disposed in a surrounding circuit area. The latch circuit is configured to perform a program operation or a read operation on the memory cells corresponding to the bit line selected by the bit line selecting circuit. The switching circuit is disposed in the surrounding circuit area, and is coupled between the bit line selecting circuit and the latch circuit. The switching circuit is configured to switch between the bit line selecting circuit and the latch circuit in response to a second control signal.

12 Claims, 4 Drawing Sheets

US 7,663,937 B2

SEMICONDUCTOR MEMORY DEVICE

CROSS-REFERENCE TO RELATED APPLICATIONS

This application claims priority from Korean Patent Application No. 2007-25507 filed on Mar. 15, 2007, the contents of which are incorporated herein by reference in its entirety.

BACKGROUND OF THE INVENTION

The present invention relates to a semiconductor memory device. More particularly, the present invention relates to a semiconductor memory device having a reduced number of high voltage transistors, thereby reducing the size of the semiconductor memory device.

A flash memory device is a kind of semiconductor memory device, and has a page buffer for programming mass storage data or reading data in a short period of time. Accordingly, a program operation or a read operation is performed in a page unit by the page buffer.

FIG. 1A is a view illustrating a conventional memory device. Here, FIG. 1A shows only a part of the flash memory device.

In FIG. 1A, the memory device includes a memory cell array 110 having a plurality of memory cells for storing data and a page buffer circuit 120.

The memory cell array 110 has a plurality of cell strings where memory cells are serially connected. Each of the cell strings is connected to a bit line.

The page buffer circuit 120 has a plurality of page buffers.

Each of the page buffers is connected to a pair of bit lines of the memory cell array 110. Each bit line pair includes an even bit line BLe and an odd bit line BLo, and the page buffer is connected to the even bit line or the odd bit line.

Each of the page buffers includes a bit line selecting circuit 121 for selecting the even bit line BLe or the odd bit line BLo, and a latch 222 for latching input/output data and assisting the program operation or the read operation.

The bit line selecting circuit 121 has first to fourth N-MOS transistors N1 to N4. Each of the transistors N1 to N4 is a high voltage transistor.

Gate voltage signals DISCHe and DISCHo are inputted to the first N-MOS transistor N1 and the second N-MOS transistor N2 to apply a voltage VIRPWR to a bit line that is not selected. Voltage signals BSLe and BSLo are applied to the third N-MOS transistor N3 and the fourth N-MOS transistor N4 to precharge or sense a selected bit line.

The flash memory device performs an erase operation of whole memory cells in a block unit to erase data stored in the memory cell array 110. To perform the erase operation, a high voltage of 20V is applied to a P well of the memory cell array 110.

FIG. 1B is a sectional view illustrating the memory device in FIG. 1A.

In FIG. 1B, an N well is formed on a substrate Psub, a P well is formed in the N well, and the memory cell array 110 is manufactured in the P well. This structure protects surrounding circuits from a high voltage applied to the P well when the erase operation is performed.

However, the high voltage applied to the P well is provided to the bit line in a forward direction when the erase operation is performed. In addition, the high voltage is applied to the bit line selecting circuit 121 in the page buffers connected to the bit line. Accordingly, the N-MOS transistors N1 to N4 of the bit line selecting circuit 121 should be manufactured with a high voltage N-MOS transistor.

The high voltage transistor is manufactured with a large length and width to tolerate the high voltage. Accordingly, when the number of high voltage transistors is increased, it is difficult to reduce the size of the memory device.

SUMMARY OF THE INVENTION

It is a feature of the present invention to provide a semiconductor memory device that reduces the number of high voltage transistors in a page buffer, thereby decreasing the size of the memory device.

A semiconductor memory device having a plurality of memory cells coupled to bit lines according to one example embodiment of the present invention includes a bit line selecting circuit, a latch circuit and a switching circuit. The bit line selecting circuit is disposed in a cell area where the memory cells are formed. The bit line selecting circuit is configured to select one of the bit lines in response to a first control signal. The latch circuit is disposed in a surrounding circuit area. The latch circuit is configured to perform a program operation or a read operation on memory cells corresponding to the bit line selected by the bit line selecting circuit. The switching circuit is disposed in the surrounding circuit area and is coupled between the bit line selecting circuit and the latch circuit. The switching circuit is configured to switch between the bit line selecting circuit and the latch circuit in response to a second control signal.

The first control signal includes a bit line selecting signal and a discharge control signal inputted in response to an input address.

The bit line selecting circuit includes at least one transistor for operating in response to the bit line selecting signal and the discharge control signal.

The transistor is not affected by a voltage applied to the bit line in the program operation, a verifying operation and the read operation of the memory cell.

The second control signal is changed in accordance with an erase operation of the memory cell.

The switching circuit is not affected by an erase voltage applied in an erase operation of the memory cell.

The second control signal activates the switching circuit when the erase operation is not performed.

The second control signal deactivates the switching circuit when the erase operation is performed.

The bit line selecting circuit is formed in a P well area where the memory cell is formed.

The switching circuit is formed in a substrate area of the memory device.

A semiconductor memory device having a plurality of memory cells coupled to bit lines according to another example embodiment of the present invention includes a page buffer. The page buffer includes a bit line selecting circuit, a latching circuit, and a switching circuit. The bit line selecting circuit is configured to select one of the bit lines in accordance with a control signal. The latching circuit is coupled to the bit line selected by the bit line selecting circuit through a sensing node. The latching circuit is configured to perform a program operation or a read operation. The switching circuit is configured to separate the bit line selecting circuit from the sensing node when an erase operation of the memory cell is performed.

A semiconductor memory device according to still another example embodiment of the present invention includes a memory cell array, a surrounding circuit, and a switching circuit. The memory cell array is configured to have memory cells coupled to bit lines. The surrounding circuit is coupled to a bit line of the memory cell array in response to a control signal, program data in the memory cells or read data from the memory cells. The switching circuit is configured to separate the memory cell array from the surrounding circuit when data in the memory cell array is erased.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in detail with reference to the accompanying drawings.

Figure 1A:
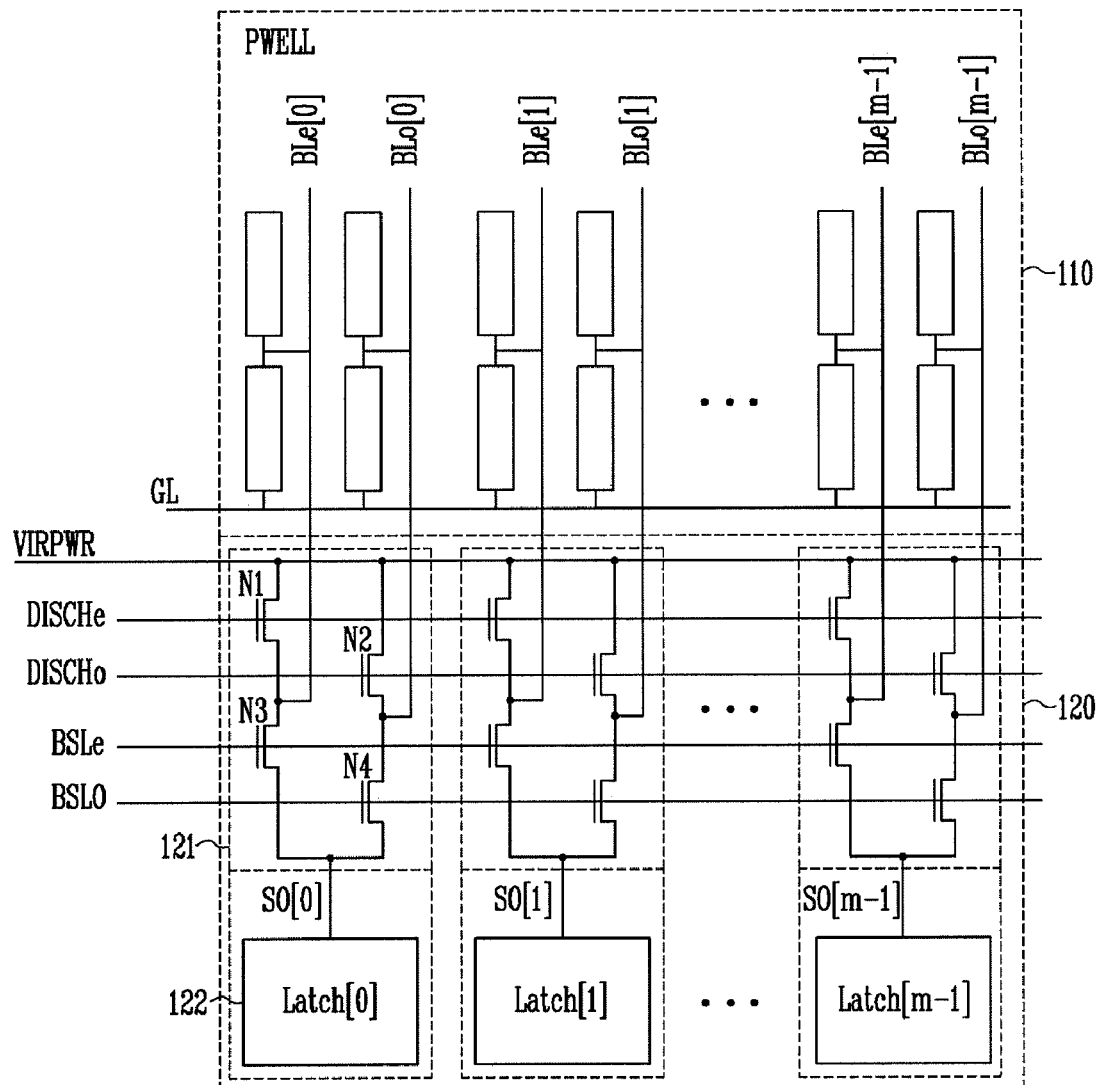
FIG. 1A is a view illustrating a conventional memory device.
Figure 1B:
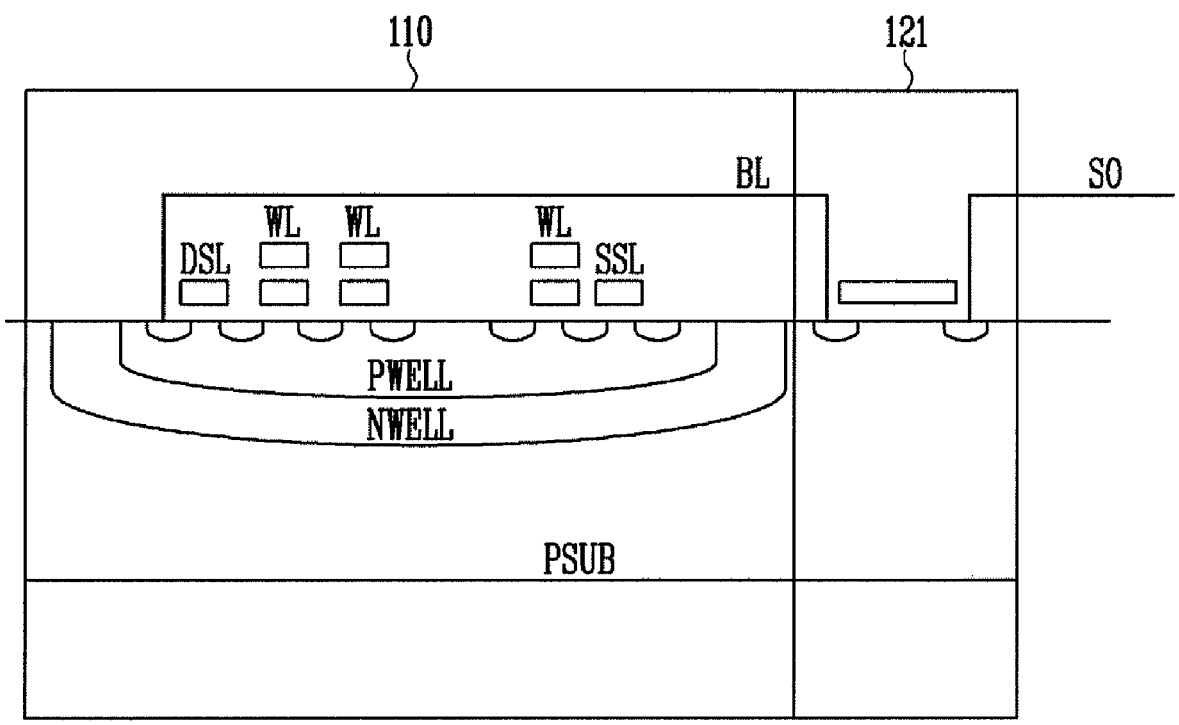
FIG. 1B is a sectional view illustrating the memory device in FIG. 1A.
Figure 2A:
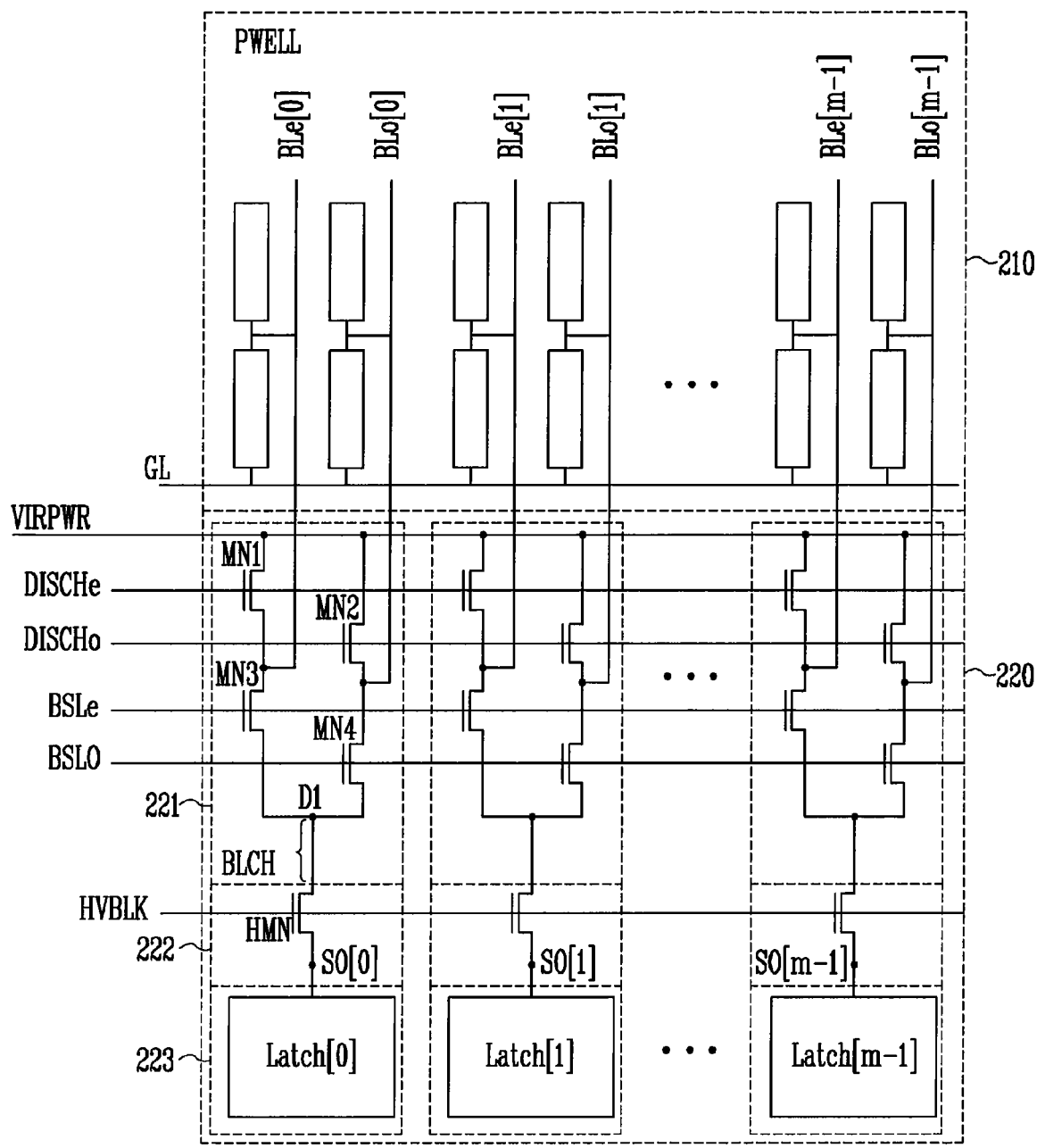
FIG. 2A is a view illustrating a memory device according to one example embodiment of the present invention.

FIG. 2A is a view illustrating a memory device according to one example embodiment of the present invention.

In FIG. 2A, the memory device of the present embodiment includes a memory cell array 210 and a page buffer circuit 220.

The memory cell array 210 includes a plurality of memory cells for storing data, and has cell strings where the memory cells are serially coupled. Each of the cell strings is connected to a bit line.

The page buffer circuit 220 has page buffers coupled to a pair of bit lines, i.e. an even bit line and an odd bit line.

Each of the page buffers includes a bit line selecting circuit 221, a high voltage switching circuit 222 and a latch 223.

The bit line selecting circuit 221 includes a first N-MOS transistor MN1 to a fourth N-MOS transistor MN4.

The high voltage switching circuit 222 has an N-MOS transistor HMN.

The first N-MOS transistor MN1 of the bit line selecting circuit 221 is coupled between a power line VIRPWR and the even bit line BLe. A discharge control signal DISCHe is coupled to a gate of the first N-MOS transistor MN1.

The second N-MOS transistor MN2 is coupled between the power line VIRPWR and the odd bit line BLo. A discharge control signal DISCHo is coupled to a gate of the second N-MOS transistor MN2.

The third N-MOS transistor MN3 is coupled between the even bit line BLe and a first node D1. An even bit line selecting signal BSLe is inputted to a gate of the third N-MOS transistor MN3.

The fourth N-MOS transistor MN4 is coupled between the odd bit line BLo and the first node D1. An odd bit line selecting signal BSLo is inputted to a gate of the fourth N-MOS transistor MN4.

The N-MOS transistor HMN is coupled between the first node D1 and a sensing node SO. A high voltage blocking signal HVBLK is inputted to a gate of the N-MOS transistor HMN. Hereinafter, a couple line between the first node D1 and a drain of the N-MOS transistor HMN is referred to as a BLCM line.

The first to fourth N-MOS transistors MN1 to MN4 are low voltage transistors, and are formed in a P well area, i.e. a cell area in which the memory cell array 210 is manufactured. In addition, the high voltage N-MOS transistor HMN is formed at a substrate Psub, i.e. a surrounding circuit area.

Figure 2B:
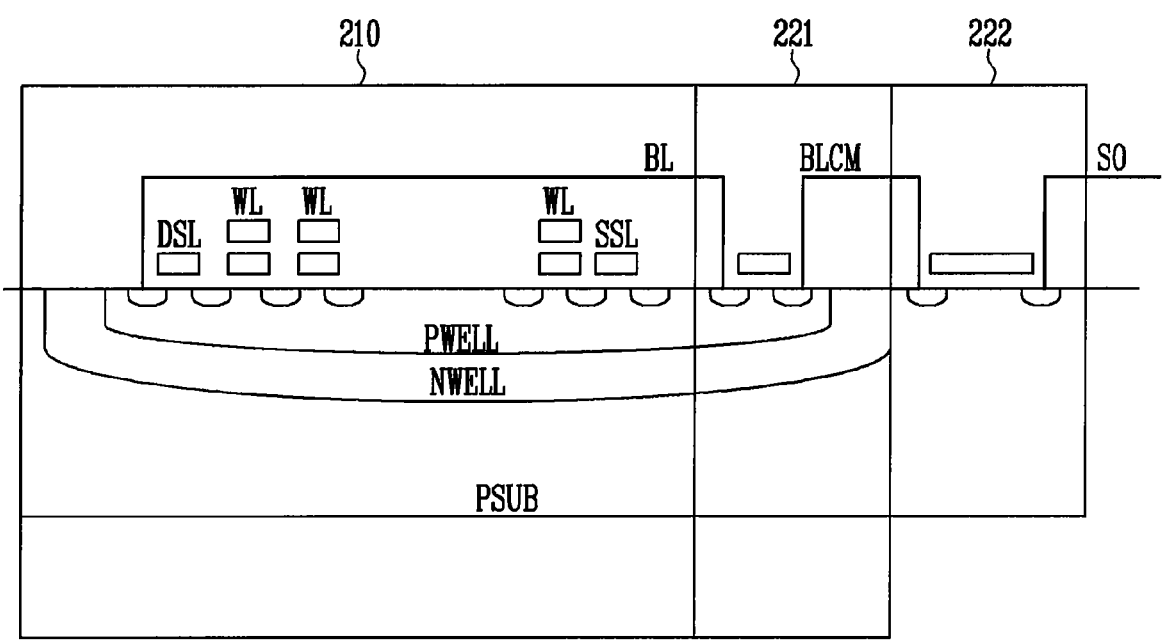
FIG. 2B is a sectional view illustrating the memory device in FIG. 2A.

FIG. 2B is a sectional view illustrating the memory device in FIG. 2A.

In FIG. 2B, an N well is formed on the substrate Psub, and the P well is formed in the N well. The memory cell array 210 is manufactured in the P well. In addition, the bit line selecting circuit 211 is formed in the P well, i.e. the N-MOS transistors MN1 to MN4 are manufactured in the P well. Since the N-MOS transistors MN1 to MN4 are low voltage transistors, the N-MOS transistors MN1 to MN4 occupy a small area in the P well.

Specifically, the transistors MN1 to MN4 of the bit line selecting circuit 221 formed in a cell area are embodied with low voltage transistors having a small size unlike the high voltage transistors of the bit line selecting circuit occupying a large area in a surrounding circuit area of a conventional memory device. Additionally, one high voltage N-MOS transistor HMN is formed as the high voltage switching circuit 222 in the surrounding circuit area. As a result, the size of the memory device may be reduced.

In the memory device, the high voltage switching circuit 222 is activated during a program operation and a read operation. Thus, the memory device of the present invention operates like the conventional memory device.

When a high voltage is applied to the P well for an erase operation, the high voltage is provided to the bit line, the BLCM line and the power line VIRPWR. The control signals BSLe, BLSo, DISCHe and DISCHo are changed into a floating state. Thus, a boosting phenomenon occurs due to a gate capacitance when the high voltage is applied to the P well. As a result, the N-MOS transistors MN1 to MN4 of the bit line selecting circuit 221 are not affected by the high voltage. Thus, the erase operation may be performed as usual even though the N-MOS transistors MN1 to MN4 are low voltage transistors. Furthermore, the high voltage blocking signal HVBLK is 0V. Thus, the high voltage switching circuit 222 is deactivated. As a result, surrounding circuits may be protected.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor memory device formed on a semiconductor substrate having a cell area and a surrounding circuit area, the semiconductor memory device comprising:

a bit line selecting circuit disposed in the cell area where memory cells are formed, wherein the bit line selecting circuit is configured to select one of a plurality of bit lines coupled to the memory cells in response to a first control signal;

a latch circuit disposed in surrounding circuit area, wherein the latch circuit is configured to perform a program operation or a read operation on the memory cells corresponding to the bit line selected by the bit line selecting circuit; and a switching circuit disposed in the surrounding circuit area, wherein the switching circuit is coupled between the bit line selecting circuit and the latch circuit, the switching circuit being configured to switch between the bit line selecting circuit and the latch circuit in response to a second control signal.

2. The semiconductor memory device of claim 1, wherein the first control signal comprises a bit line selecting signal and a discharge control signal inputted in response to an input address.

3. The semiconductor memory device of claim 2, wherein the bit line selecting circuit includes at least one transistor for operating in response to the bit line selecting signal and the discharge control signal.

4. The semiconductor memory device of claim 3, wherein the transistor is not affected by a voltage applied to the bit line in the program operation, a verifying operation and the read operation of the memory cell.

5. The semiconductor memory device of claim 1, wherein the second control signal is changed in response to an erase operation of the memory cell.

6. The semiconductor memory device of claim 5, wherein the second control signal activates the switching circuit when the erase operation is not performed.

7. The semiconductor memory device of claim 5, wherein the second control signal deactivates the switching circuit when the erase operation is performed.

8. The semiconductor memory device of claim 1, wherein the switching circuit is not affected by an erase voltage applied in an erase operation of the memory cell.

9. The semiconductor memory device of claim 1, wherein the bit line selecting circuit comprises low voltage transistors.

10. The semiconductor memory device of claim 9, wherein each of the low voltage transistors is a low voltage NMOS transistor.

11. The semiconductor memory device of claim 1, wherein the switching circuit comprises a high voltage transistor.

12. The semiconductor memory device of claim 1, wherein the high voltage transistor is a high voltage NMOS transistor.

* * * * *